United States Patent [19]
Burton et al.

[11] Patent Number: 5,250,856
[45] Date of Patent: Oct. 5, 1993

[54] DIFFERENTIAL INPUT BUFFER-INVERTERS AND GATES

[75] Inventors: Edward A. Burton, Lindon; Thomas D. Fletcher, Orem, both of Utah

[73] Assignee: North American Philips Corp., New York, N.Y.

[21] Appl. No.: 863,551

[22] Filed: Jul. 1, 1991

Related U.S. Application Data

[63] Continuation of Ser. No. 458,217, Dec. 28, 1989, abandoned.

[51] Int. Cl.[5] .......................................... H03K 19/02
[52] U.S. Cl. ................................. 307/446; 307/475; 307/451
[58] Field of Search ............... 307/446, 443, 570, 270

[56] References Cited

U.S. PATENT DOCUMENTS

| | | | |
|---|---|---|---|
| 4,301,383 | 11/1981 | Taylor | 307/446 |
| 4,558,234 | 12/1985 | Suzuki et al. | 307/446 |
| 4,616,146 | 10/1986 | Lee et al. | 307/446 |
| 4,638,186 | 1/1987 | McLaughlin | 307/446 |
| 4,649,294 | 3/1987 | McLaughlin | 307/446 |
| 4,733,110 | 3/1988 | Hara et al. | 307/446 |
| 4,769,561 | 9/1988 | Iwamura et al. | 307/270 |
| 4,783,604 | 11/1988 | Ueno | 307/446 |
| 4,804,869 | 2/1989 | Masuda et al. | 307/446 |
| 4,883,979 | 11/1989 | Tran | 307/446 |
| 4,883,988 | 11/1989 | Ide et al. | 307/443 |

FOREIGN PATENT DOCUMENTS

| | | |
|---|---|---|
| 0212004 | 11/1985 | European Pat. Off. |
| 0398808 | 11/1990 | European Pat. Off. |
| 61-274512 | 5/1985 | Japan |
| 62-26691 | 2/1987 | Japan |
| 62-30221 | 10/1987 | Japan |

OTHER PUBLICATIONS

IBM Technical Disclosure Bulletin, vol. 29, No. 3, Aug. 1986.
BiCMOS Circuit Technology for a High-Speed SRAM; Takakuni Douseki et al, IEEE Journal of Solid State Circuits, vol. 23, No. 1, Feb. 1988.
A 9100 Gate ECL/TTL Compatible BiCMOs Gate Garray; Lin et al.
13-ns, 500-mW, 64-kbit ECL RAM Using Hi-BIC-MOS Technology, Ogiue et al, IEEE Jour. of Solid State, vol. SC-21, No. 5, Oct. 1986.
High Performance BIMOS Gate Arrays with Embedded Configurable Static Memory Bennett et al, 1987 IEEE.

(List continued on next page.)

*Primary Examiner*—Edward P. Westin
*Assistant Examiner*—Andrew Sanders
*Attorney, Agent, or Firm*—David Schreiber

[57] ABSTRACT

High speed and high drive BiCMOS buffers, inverters, and gates receiving synchronous differential inputs are provided having at least two npn bipolar transistors and at least one nMOS transistor. The first bipolar transistor has a base receiving a noninverting input, a collector coupled to the high voltage rail, and an emitter coupled to the circuit output. In several embodiments, the second bipolar transistor has its collector coupled to the emitter of the first bipolar transistor, its emitter coupled to ground, and its base coupled to the source of an nMOS transistor which is receiving the inverting input at its gate. In these embodiments, the output is taken from the emitter of the first bipolar transistor and the collector of the second bipolar transistor with the first bipolar transistor pulling up when the input is high, and the second bipolar transistor pulling down when the input is low. Also, in several of the embodiments, the first bipolar transistor is coupled to a pMOS device with the collector connected to the source, and the emitter connected to the drain. The gate of the pMOS device is coupled to the inverting input, sometimes via the emitter of another bipolar transistor having its base connected to the inverting input. The pMOS device acts to pull up the output voltage of the circuit from the voltage provided at the emitter of the first bipolar transistor to the voltage of the high voltage rail.

39 Claims, 6 Drawing Sheets

OTHER PUBLICATIONS

Perspective on BiCMOS VLSI's, Kubo et al, IEEE Jour. of Solid State, vol. 23, No. 1, Feb. 1988.

A Comparison of CMOS Circuit Techniques: Differential Cascode Voltage Switch Logic Versus Conventional Logic; Chu et al, IEEE Jour. of Solid-States, vol. Sc 22, No. 4, Aug. 1987.

Implementation of Iterative Networks with CMOS Differential Logic; Shih-Lien IEEE Journal of Solid-State Circuits, vol. 23, No. 4, Aug. 1988.

0.45 ns 7K Hi-BiCMOs Gate Array with Configurable 3-Port 4.6 K SRAM Nishio et al, Hitachi Research Laboratory IEEE 1987 Custom Integrated Circuits.

A 4-ns 4K×1-bit Two-Port BiCMOS SRAM, Yang et al, IEEE Journal of Solid State Circuits, vol. 23, No. 5 Oct. 1988.

A 12-ns ECL I/O 256 K×1-bit SRAM Using a 1-um BiCMOS Technology Kertis et al, IEEE Journal of Solid State Circuit, vol. 23, No. 5, Oct. 1988.

High Speed Sram's Suzuki et al, 1989 IEEE International Solid State Circuits Conference.

WAM 2.6 An 8ns BiCMOS 1 Mb ECL SRAM with a Configurable Memory Array Size 1989 IEEE International Solid State Circuits Conference Feb. 15, 1989.

WAM 2.7 An 8ns 1 Mb ECL BiCMOS Sram, 1989 IEEE International Solid State Circuits Conference, Feb. 15, 1989.

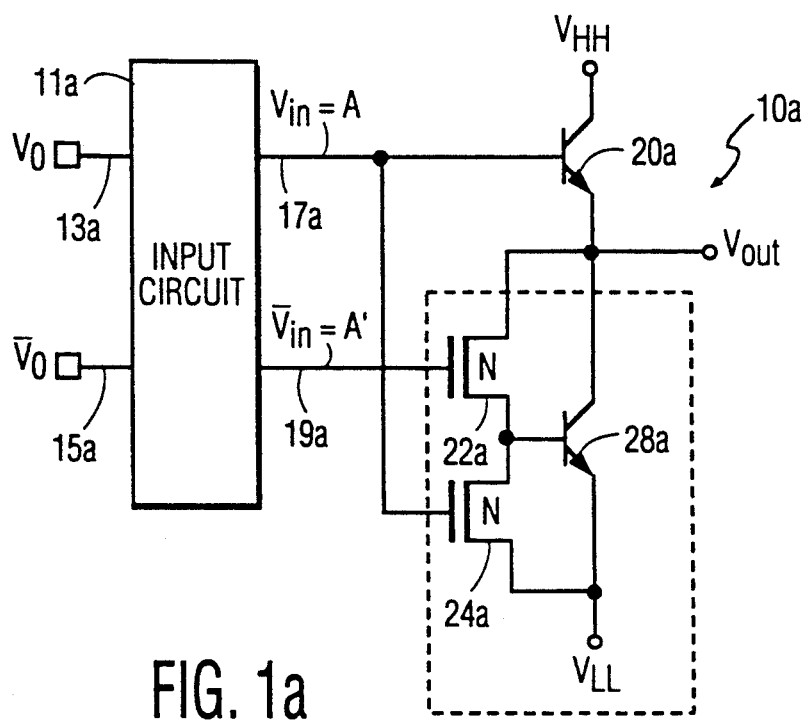
FIG. 1a
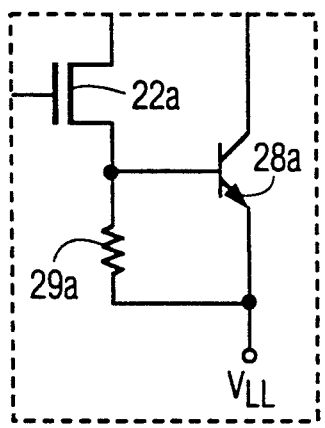
FIG. 1a(1)
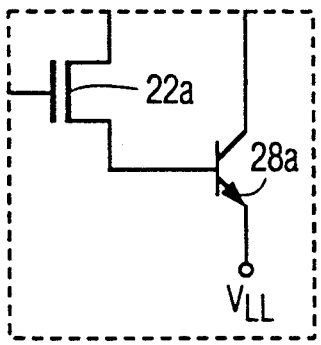
FIG. 1a(2)

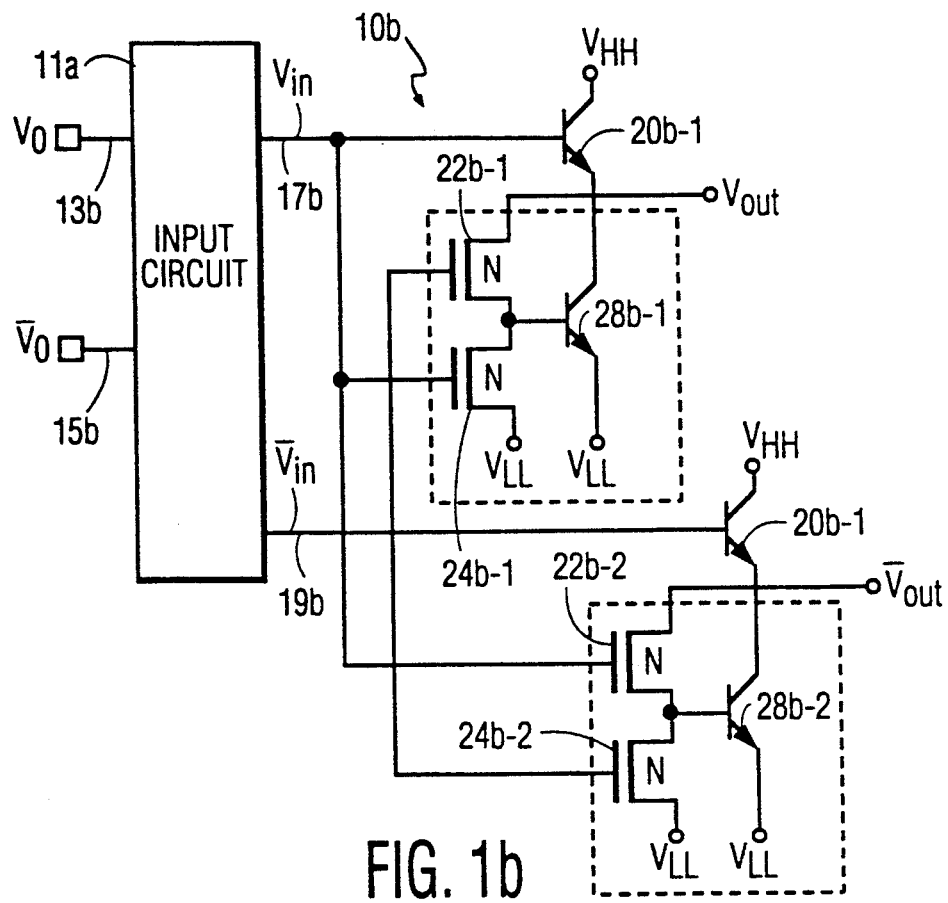
FIG. 1b
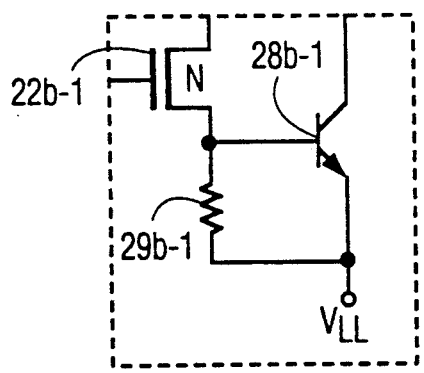
FIG. 1b(1)
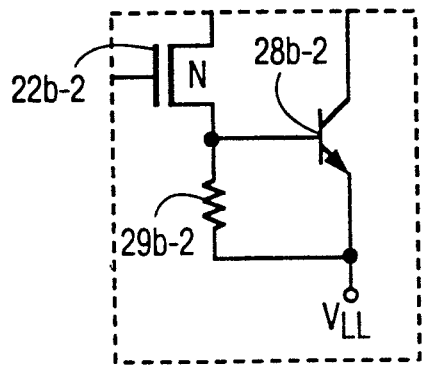
FIG. 1b(2)

DIFFERENTIAL INPUT BUFFER-INVERTERS AND GATES

CROSS-REFERENCE TO RELATED APPLICATION

This is a continuation of U.S. patent application Ser. No. 458,217, filed Dec. 28, 1989, now abandoned.

BACKGROUND OF THE INVENTION

1. Field of Use

The present invention relates to devices utilizing bipolar and field effect transistors (FETs). More particularly, the present invention relates to BiCMOS buffers, inverters, and gates which utilize differential inputs and provide increased output drive at a buffered output.

2. Background Art

The new technology of BiCMOS which utilizes both bipolar and CMOS transistors in a single device has been increasingly explored in the past few years. The advantage of BiCMOS circuits over conventional CMOS or bipolar circuits is that the high speed characteristic of bipolar circuits can be obtained with an integration density and low power consumption characteristic of CMOS circuits.

Typical of BiCMOS buffers, inverters and gates known in the art are the following patents and disclosures: U.S. Pat. No. 4,558,234 to Suzuki et al.; U.S. Pat. No. 4,638,186 to McLaughlin; U.S. Pat. No. 4,649,294 to McLaughlin; U.S. Pat. No. 4,733,110 to Hara et al.; EPO Publication 0212004; IBM TDB Vol. 29, #3, August 1986, p.1191-1192; Japanese Patent Publication (JPP) 62-26691 to Miyaoka et al; JPP 62-230221 to Ueno; and JPP 61-274512 to Nakamura. Additional buffers, inverters and gates are disclosed in the following articles: Liang-Tsai Lin et al., "A 9100 Gate ECL/TTL Compatible BiCMOS Gate Array", *IEEE 1987 Custom Integrated Circuits Conference:* pp.190-194; P. Simon Bennett et al., "High Performance BIMOS Gate Arrays with Embedded Configurable Static Memory", *IEEE 1987 Custom Integrated Circuits Conference:* pp.195-197; Yoji Nishio et al., "0.45ns 7K Hi-BiCMOS Gate Array with Configurable 3-Port 4.6K SRAM", *IEEE 1987 Custom Integrated Circuits Conference:* pp.203-204; Chu et al., "A Comparison of CMOS circuit Techniques: Differential Cascode Voltage Switch Logic Versus Conventional Logic", *IEEE Journal of Solid-State Circuits:* Vol Sc-22, No. 4 (Aug. 1987); Masaharu Kubo, et al., "Perspective on BiCMOS VLSI's", *IEEE Journal of Solid-State Circuits:* Vol. 23, No. 1 (Feb. 1988); Shih-Lien Lu, "Implementation of Iterative Networks with CMOS Differential Logic" *IEEE Journal of Solid-State Circuits:* Vol. 23, No. 4 (Aug. 1988).

Common to almost all of the above disclosures is that either a single input or non-differential multiple inputs are utilized as inputs into the circuits, or that a non-synchronous differential input is utilized. The non-synchronous differential input is typically provided via use of one or more inverters which slows the circuit and causes the differential input to have phase disparity.

SUMMARY OF THE INVENTION

It is therefore an object of the invention to provide differential input BiCMOS buffers, inverters, and gates.

It is another object of the invention to provide high drive differential input BiCMOS buffers, inverters and gates.

It is a further object of the invention to provide differential input, differential output BiCMOS buffers, inverters and gates.

It is yet another object of the invention to provide differential input, differential output BiCMOS buffers and inverters which are cascadable.

It is still another object of the invention to provide high drive differential input buffers and inverters with only one transistor delay.

To meet these objects, each circuit of the invention contains a pair of bipolar transistors and an MOS transistor. One of the bipolar transistors has a base responsive to the noninverting input of a differential input, a collector coupled to a first voltage reference rail, and an emitter. In several embodiments, the other bipolar transistor has a base, a collector coupled to the emitter of the first-mentioned bipolar transistor, and an emitter coupled to a second voltage rail. In these embodiments, the MOS transistor has a gate electrode responsive to the inverting input of the differential input, a drain coupled to the emitter of the first bipolar transistor, and a source coupled to the base of the second-mentioned bipolar transistor. A circuit output is available at a node coupled to the emitter of the first bipolar transistor.

The noninverting and inverting inputs are normally substantially synchronous and are provided from an input circuit which may take many forms. Preferably, the two bipolar transistors are npn devices, and the MOS transistor is an nMOS FET. In this case, the first and second rails respectively are high and low voltage rails.

Some of the preceding embodiments include a further MOS transistor of opposite MOS type—i.e., complementary—to the first-mentioned MOS transistor. The further MOS transistor has a gate electrode, a source coupled to the first rail, and a drain coupled to the emitter of the first bipolar transistor. The gate electrode of the further MOS device is responsive to the inverted input, sometimes via the base-emitter junction of another bipolar transistor. The further MOS transistor acts to pull the circuit output to the voltage of the first rail when the first transistor turns on and thereby avoids the 1-Vbe reduction in output voltage drive that would otherwise normally occur. Consequently, the circuit is cascadable.

Additional embodiments include the aforementioned circuitry plus duplicative circuitry which is arranged such that the noninverted input signal is received at the gate electrodes and bases of transistors corresponding to transistors where the inverted input signal is received by the aforementioned circuitry, and vice versa. In most of these embodiments, a differential output is obtained, with the noninverting output signal obtained from the emitter of a bipolar transistor of the "original" circuit, and the inverting output signal obtained from the emitter of a bipolar transistor of the duplicative circuit.

In accord with another aspect of the invention, npn transistors can be replaced with pnp transistors; in which case the polarities of the nMOS and pMOS devices are reversed along with the polarities of the voltage rails. If desired, where duplicative circuitry is employed, the duplicative circuitry can employ transistors of opposite polarity to the original circuitry.

Additional objects and advantages of the invention will become evident upon reference to the detailed description in conjunction with the provided drawings.

BRIEF DESCRIPTION OF THE DRAWINGS

FIGS. 1a and 1b are circuit diagrams of differential input BiCMOS buffers having a single ended output and a differential output respectively.

FIGS. 1a(1) and 1a(2) are circuit diagrams for alternative versions of the circuitry shown in phantom in FIG. 1a.

FIGS. 1b(1) and 1b(2) are circuit diagrams for an alternative version of the circuitry shown in phantom in FIG. 1b.

DETAILED DESCRIPTION OF THE PREFERRED EMBODIMENTS

Figure 2A:
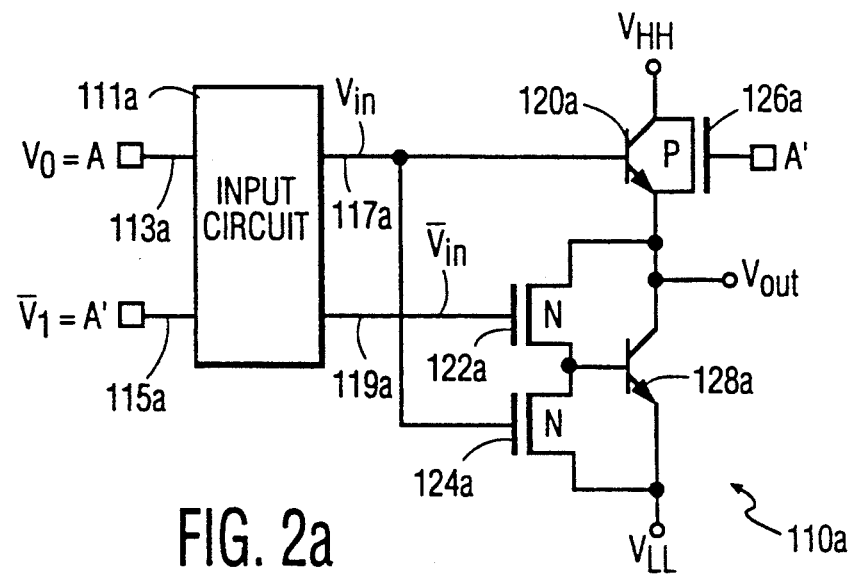
FIGS. 2a and 2b are circuit diagrams of cascadable differential input BiCMOS bufffers having a single ended output and a differential output respectively.

Before describing the circuits shown in the figures, it should be understood that for purposes of this application, the term "BiCMOS" is used in its broadest sense to refer to circuits having both bipolar transistors and FETs, regardless of whether MOSFETs or other types of IGFETs are used or whether both p-channel and n-channel type MOS transistors are utilized in a single circuit. In fact, any description of a transistor as a MOS transistor is intended to be understood in its broadest sense to include other types of IGFETs and not to be limited to metal-gate FETs. Also, it should be understood that while the circuits are described as preferably including npn bipolar transistors, if the polarities of the bipolar and MOS transistors are reversed, equivalent functional circuits are obtained. Further, it will be appreciated that while "inputs" and "outputs" to and from the circuit are described, little distinction is provided regarding whether the inputs or outputs are signals or nodes, as those skilled in the art will readily appreciate whether a signal or node is being described.

FIGS. 1a and 1b respectively show buffer circuits 10a and 10b, where like parts are coded with like reference numbers. The elements in FIG. 1a are further coded with the designation "a", while the corresponding elements in FIG. 1b are further coded with the designation "b-1". The duplicate elements in FIG. 1b are further coded with the designation "b-2". The designations "a", "b-1" and "b-2" are dropped in the following discussion when FIGS. 1a and 1b are described together.

With the foregoing in mind, buffer circuit 10 in the two figures contains an input circuit 11 that receives one or both of complementary voltages $V_0$ and $\overline{V}_0$ on lines 13 and 15. Input circuit 11 provides therefrom over lines 17 and 19 a synchronous differential signal with noninverting signal $V_{in}$ and inverting signal $\overline{V}_{in}$ (the terms "noninverting" and "inverting" being terms relative to each other only). The input circuit 11 may take many forms, provided the signals it outputs over lines 17 and 19 comprise a substantially synchronous differential signal. For example, input circuit 11 may be a RAM with dual output ports which are identically clocked. Alternatively, input circuit 11 may include an inverter from which the inverting signal is obtained, in conjunction with a parallel pass gate which introduces identical delay to the noninverted signal.

In FIG. 1a, where a single output $V_{out}$ is provided, the noninverting signal $V_{in}$ of the differential input signal is provided to the base of the npn bipolar transistor 20a, which has its collector connected to the high voltage rail $V_{HH}$. The noninverting signal $V_{in}$ is also provided to the gate electrode of nMOS transistor 24a which has its source coupled to the low voltage rail $V_{LL}$. The inverted signal $\overline{V}_{in}$ is provided to the gate of nMOS transistor 22a which has its source coupled to the drain of transistor 24a, and its drain coupled to the emitter of bipolar transistor 20a. A second bipolar transistor 28a has its collector coupled to the emitter of bipolar transistor 20a, its emitter coupled to the source of nMOS transistor 24a, and its base coupled to the drain of transistor 24a and the source of transistor 22a. The emitter of transistor 20a, the collector of transistor 28a and the drain of MOS transistor 22a are all connected together through a node from which the output $V_{out}$ of buffer circuit 10a is taken.

In operation, when the noninverted signal $V_{in}$ is high and the inverted signal $\overline{V}_{in}$ is low, the high signal at the base of bipolar transistor 20a quickly turns it on and pulls up the output voltage $V_{out}$ to $V_{in}-V_{be}$ where $V_{be}$ is the typical base-emitter voltage drop for a conducting bipolar transistor. At the same time, the high signal is fed to nMOS transistor 24a which turns on. When transistor 24a is turned on, it brings its drain voltage down to the voltage at its source. Thus, the voltage at the drain of transistor 24a is brought low (i.e., to the voltage $V_{LL}$), and hence the voltage at the base of bipolar transistor 28a is not sufficient to turn bipolar transistor 28a on. While the voltage at the base and gate electrode of transistors 20a and 24a is high, the voltage at the gate electrode of transistor 22a is low. With a low voltage at its gate electrode, transistor 22a stays off. Thus, the output $V_{out}$ is controlled by the voltage at the emitter of bipolar transistor 20a, as MOS transistor 22a is off as is bipolar transistor 28a.

When $V_{in}$ goes low, and $\overline{V}_{in}$ goes high, the base of transistor 20a and the gate electrode of transistor 24a see a low voltage and turn off. Meanwhile, with a high voltage being fed to the gate electrode of transistor 22a, transistor 22a turns on. Since the voltage at the drain of transistor 22a was high (at $V_{HH}-V_{be}$), the source of transistor 22a is pulled upwards, thereby turning on bipolar transistor 28a. When bipolar transistor 28a turns on, the voltage at the base of transistor 28a settles at $V_{LL}+V_{be}$, or simply $V_{be}$ where $V_{LL}$ is zero. Thus, the drain of transistor 22a is pulled down to a voltage of $V_{be}$, and the voltage at the output of the circuit is brought low to $V_{be}$.

The arrangement with bipolar transistors 20a and 28a has its voltage output controlled by transistors 20a and 28a depending on the input values $V_{in}$ and $\overline{V}_{in}$. When $V_{in}$ is high, transistor 20a is on and pulls the voltage output high, while when $\overline{V}_{in}$ is high, transistor 28a is on and pulls the voltage output low.

Referring to FIG. 1a(1), nMOS transistor 24a can be replaced with a resistor 29a connected between the base of npn transistor 28a and the low voltage rail $V_{LL}$.

Transistor 24a can also be deleted from the buffer. See FIG. 1a(2).

The portion 10b of the circuit of FIG. 1b follows that of the portion 10a of the circuitry of FIG. 1a, but FIG. 1b further includes a duplicate 20b of the circuit 10b with reversed inputs which provides an inverted output $\overline{V}_{out}$. The input $V_{in}$ is fed to npn bipolar transistor 20b-1 and nMOS transistor 24b-1, as well as nMOS transistor 22b-2. The input $\overline{V}_{in}$ is fed to nMOS transistor 22b-1, as well as to bipolar transistor 20b-2 and nMOS transistor 24b-2. A differential output with noninverting output $V_{out}$ and inverting output $\overline{V}_{out}$ is taken from the emitters of transistors 20b-1 and 20b-2. This differential output is synchronous, buffered and suffers a delay of only one transistor delay.

As in FIG. 1a, transistors 24b-1 and 24b-2 can be replaced with resistors. See FIGS. 1b(1) and 1b(2) where these resistors are shown as items 29b-1 and 29b-2.

It should be appreciated by those skilled in the art that the buffer circuits of FIGS. 1a and 1b may act as inverters as well as buffers simply by reversing the polarities of inputs $V_{in}$ and $\overline{V}_{in}$.

Figure 2B:
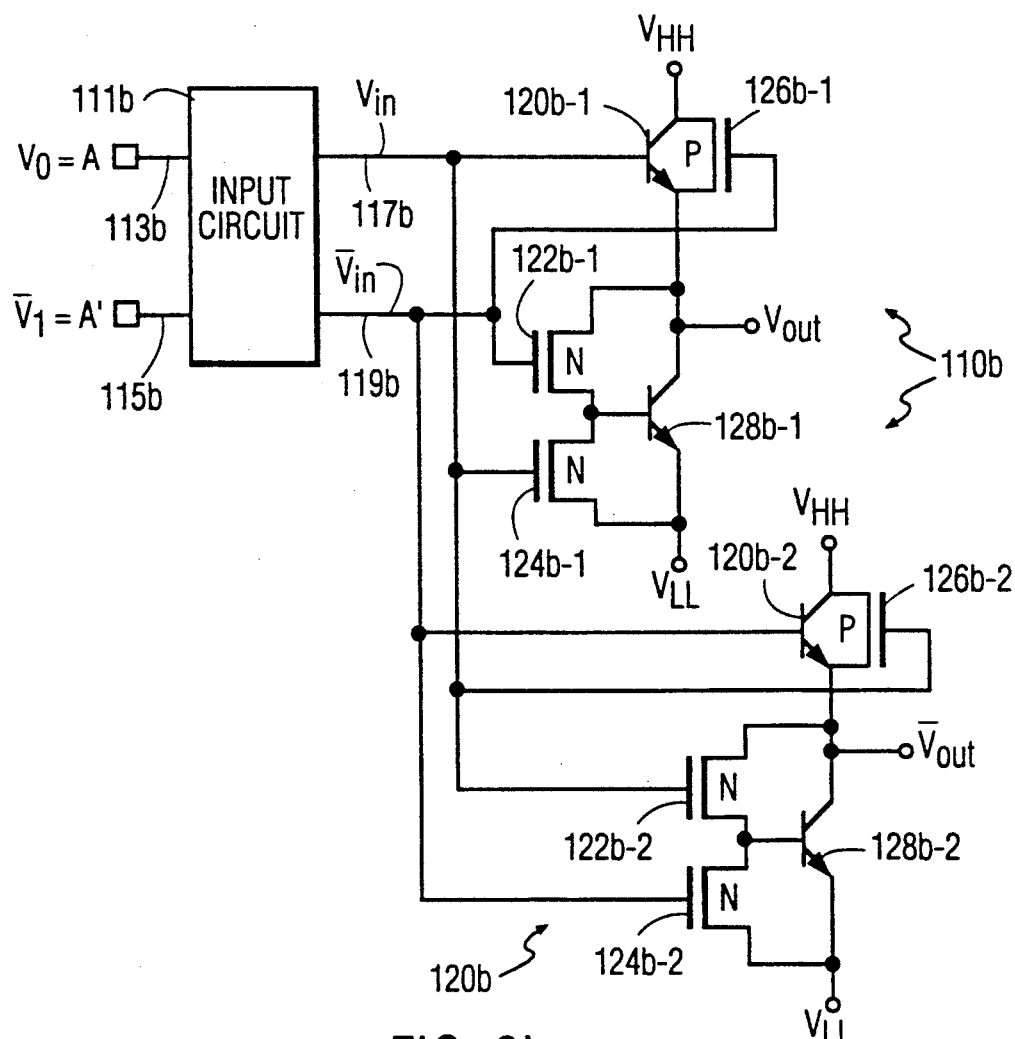

FIGS. 2a and 2b provide second embodiments of buffers/inverters which are very similar to those of FIGS. 1a and 1b, and where like parts are indicated by providing FIGS. 2a and 2b with numerals one hundred removed from their counterparts in FIGS. 1a and 1b. Buffer 110a in FIG. 2a receives a synchronous differential input signal ($V_{in}$, $\overline{V}_{in}$) from input circuit 111a. Buffer 110a includes npn bipolar transistors 120a and 128a, and MOS transistors 122a and 124a in the same configuration of like transistors of FIG. 1a. The only difference between the buffer of FIG. 2a and that of FIG. 1a is the inclusion of a pMOS transistor 126a (pMOS transistors 126b-1 and 126b-2 for FIG. 2b). Transistor 126a has its source connected to the collector of transistor 120a, its drain connected to the emitter of transistor 120a, and its gate electrode connected to the inverting input $\overline{V}_{in}$.

When input $V_{in}$ is high and input $\overline{V}_{in}$ low, bipolar transistor 120a turns on quickly, while pMOS transistor 126a turns on a little more slowly. Because the source of transistor 126a is connected to the high voltage rail, transistor 126a pulls the voltage at its drain from $V_{in} - V_{be}$ (which is the voltage at the emitter of transistor 120a when the Vin input is at the high input voltage $V_{in}$) all the way up to $V_{HH}$. Because the output voltage swings all the way up to $V_{HH}$, the circuits of FIGS. 2a and 2b can be used in series without a progressive degradation in the high output voltage. The circuits of FIGS. 2a and 2b can be used with the resistor 29 shown in FIGS. 1a(1), 1b(1), and 1b(2) to achieve rail to rail switching which eliminates leakage currents associated with partial input transitions driving CMOS gates.

Figure 3:
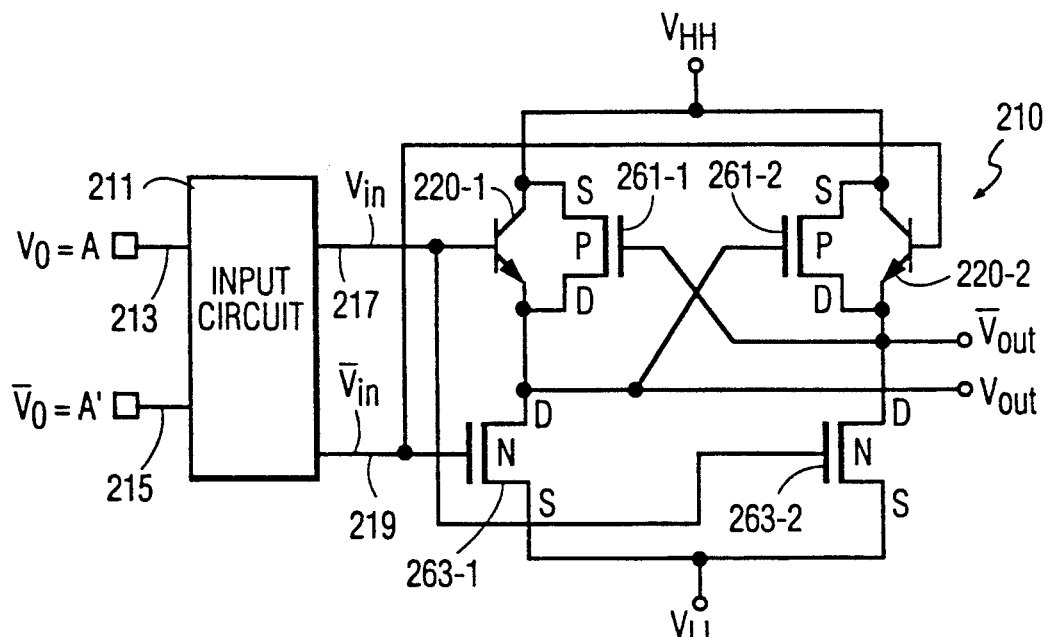
FIG. 3 is a circuit diagram of a cascadable differential input, differential output BiCMOS buffer/inverter.

Turning to FIG. 3, a third embodiment of a differential buffer/inverter is provided. Again an input circuit 211 is shown receives voltages $V_0$ and $\overline{V}_0$ on lines 213 and 215 and provides a synchronous differential output over lines 217 and 219 with the noninverting signal $V_{in}$, and the inverting signal $\overline{V}_{in}$. The $V_{in}$ signal from circuit 211 serves as the noninverting input into buffer 210 and is fed to the base of bipolar transistor 220-1. Bipolar transistor 220-1 has a collector coupled to the high voltage rail, and an emitter coupled to the noninverting output of the buffer circuit. Coupled to transistor 220-1 is a pMOS transistor 261-1 with its drain coupled to the collector of transistor 220-1 and its source coupled to the emitter of transistor 220-1. Also coupled to the emitter of transistor 220-1 is the drain of nMOS transistor 263-1. Transistor 263-1 is provided with the inverting input $\overline{V}$ in at its gate electrode, and has its source coupled to the low voltage rail. Noninverting output $V_{out}$ is taken from a node between the emitter of transistor 220-1 and the drain of transistor 263-1.

Buffer 210 also includes another set (i.e. duplicative set) of transistors, including bipolar transistor 220-2, pMOS transistor 261-2, and nMOS transistor 263-2. The base of transistor 220-2 is coupled to the inverted input $\overline{V}_{in}$, while the collector of transistor 220-2 is coupled to the high voltage rail. Transistor 261-2 has its source coupled to the collector of transistor 220-2 and its drain coupled to the emitter of transistor 220-2. The gate electrode of transistor 261-2 is coupled to the emitter of transistor 220-1 and the drain of transistor 261-1, while the emitter of transistor 220-2 and drain of transistor 261-2 are coupled to the gate electrode of transistor 261-1. Transistor 263-2 is provided with input $V_{in}$ at its gate. The drain of transistor 263-2 is coupled to the emitter of transistor 220-2, and the source of transistor 263-2 is coupled to the low voltage rail. Inverting output $\overline{V}_{out}$ is taken from a node between the emitter of transistor 220-2 and the drain of transistor 263-2.

With the provided arrangement, when $V_{in}$ is high ($\overline{V}_{in}$ low), transistor 220-1 turns on quickly and pulls the noninverting output $V_{out}$ to $V_{in} - V_{be}$. Similarly, transistor 263-2 turns on, pulling its drain, and the gate electrode of pMOS transistor 261-1, to $V_{LL}$. Thus, pMOS transistor 261-1 turns on and pulls output $V_{out}$ up to $V_{HH}$, much in the same way as described above with reference to FIGS. 2a and 2b. Also, with $V_{in}$ high, as aforementioned, transistor 263-2 is turned on, pulling its drain and hence the inverting output $\overline{V}_{out}$ of the differential output low to the voltage $V_{LL}$ at its source. When $\overline{V}_{in}$ is high, the inverting signal $\overline{V}_{in}$ applied to the base of transistor 220-2 and the gate electrode of transistor 263-1 is low and turns transistors 220-2 and 263-1 off. With transistor 220-2 off, the inverting output voltage $\overline{V}_{out}$ at the emitter of transistor 220-2 is free to be controlled by transistor 263-2. Similarly, with transistor 263-1 off, the noninverting output voltage $V_{out}$ at the drain of transistor 263-1 is free to be controlled by transistors 220-1 and 261-1. It is also noted that with $V_{in}$ high, and the voltage at the drain of transistor 261-1 high, transistor 261-2 is off and does not try to pull the voltage high at the inverting output of the circuit.

When $V_{in}$ goes low and $\overline{V}_{in}$ goes high, the voltage at the base of transistor 220-1 and gate electrode of transistor 263-2 goes low, turning off those transistors, while the voltage at the base of transistor 220-2 and gate electrode of transistor 263-1 goes high, turning on those transistors. With transistor 220-2 on, and transistor 263-2 off, the voltage at the emitter of transistor 220-2 goes to $V_{in} - V_{be}$, while with transistor 220-1 off and transistor 263-1 on, the voltage at the emitter of transistor 220-1 (i.e., at the drain of transistor 263-1) goes to $V_{LL}$. Since the source of transistor 261-2 is coupled to the emitter of transistor 220-1, transistor 261-2 turns on and pulls the voltage at the emitter of transistor 220-2 (and hence at the inverting output $\overline{V}_{out}$) up to $V_{HH}$. Thus, the outputs $V_{out}$ and $\overline{V}_{out}$ are inverted from when $V_{in}$ is high and $\overline{V}_{in}$ is low.

The buffer/inverter embodiment of FIG. 4 combines aspects of the buffer/inverters of FIGS. 2b and 3, and is hereinafter described with like parts indicated by numbers one hundred and two hundred removed from their counterparts. The buffer/inverter 310 of FIG. 4 includes the bipolar transistors 320-1 and 320-2 whose bases are coupled to the inputs $V_{in}$ and $\overline{V}_{in}$, and pMOS transistors 361-1 and 361-2 which are coupled to the bipolar transistors 320-1 and 320-2 in the way shown in FIG. 3 and which provide the same features discussed above with reference to FIG. 3. Further, buffer 310 has additional npn bipolar transistors 328-1 and 328-2, and additional nMOS transistors 322-1, 322-2, 324-1, and 324-2.

When $V_{in}$ goes high ($\overline{V}_{in}$ low), bipolar transistor 320-1 turns on and bipolar transistor 320-2 turns off, MOS transistors 324-1 and 322-2 turn on, and MOS transistors 322-1 and 324-2 turn off. As a result of MOS transistor 324-1 turning on, bipolar transistor 328-1 is off. With bipolar transistor 328-1 off and bipolar transistor 320-1 on, the noninverting output $V_{out}$ is brought high to $V_{in} - V_{be}$. Also, with MOS transistor 322-2 on and MOS transistor 324-2 off, bipolar transistor 328-2 is turned on. With bipolar transistor 328-2 on and bipolar transistor 320-2 off, the inverting output $\overline{V}_{out}$ is brought low to $V_{LL} + V_{be}$. With the voltage at the collector of transistor 328-2 coupled to the gate electrode of pMOS transistor 361-1 and being low, pMOS transistor 361-1 turns on and boosts the noninverting output $V_{out}$ up to $V_{HH}$. Similarly, the high voltage output of $V_{out}$ is coupled to the gate of pMOS transistor 361-2 thereby keeping transistor 361-2 off and the voltage at the inverting output $\overline{V}_{out}$ low.

When the polarities of $V_{in}$ and $\overline{V}_{in}$ switch, those transistors which were on turn off and vice versa. Thus, bipolar transistor 328-1 pulls the noninverting output $V_{out}$ low, while bipolar transistor 320-2, and then pMOS transistor 361-2, pulls the inverting output $\overline{V}_{out}$ high.

Figure 4:
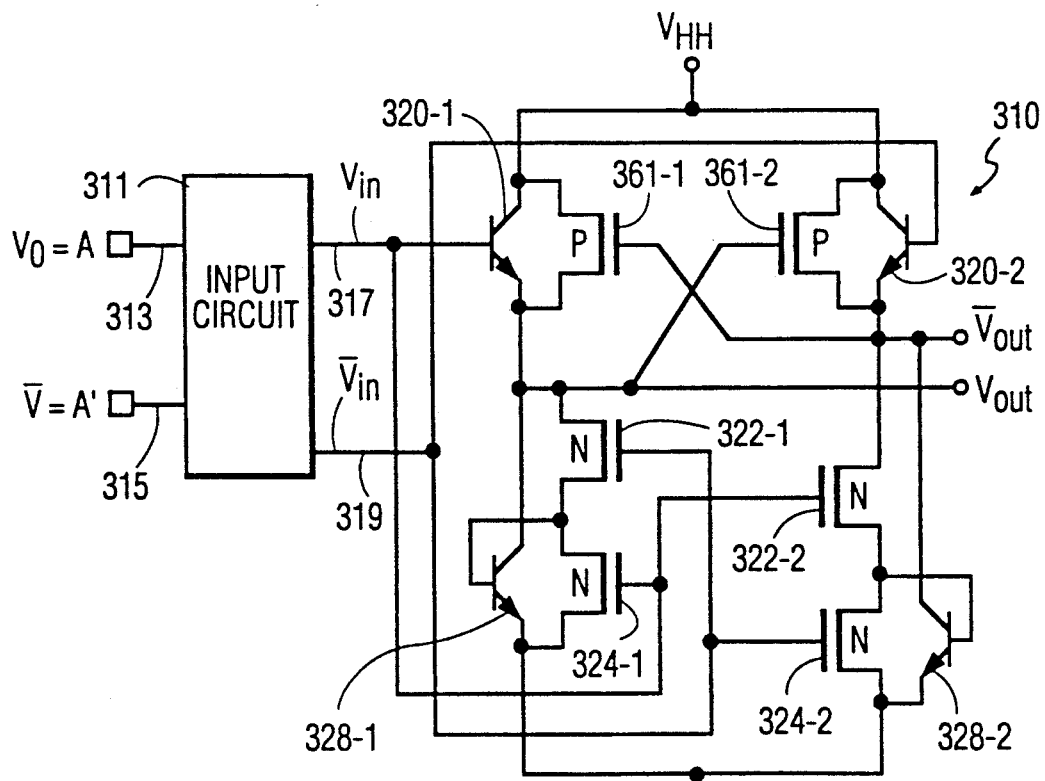
FIG. 4 is a circuit diagram of another cascadable differential input, differential output BiCMOS buffer/inverter.
Figure 5A:
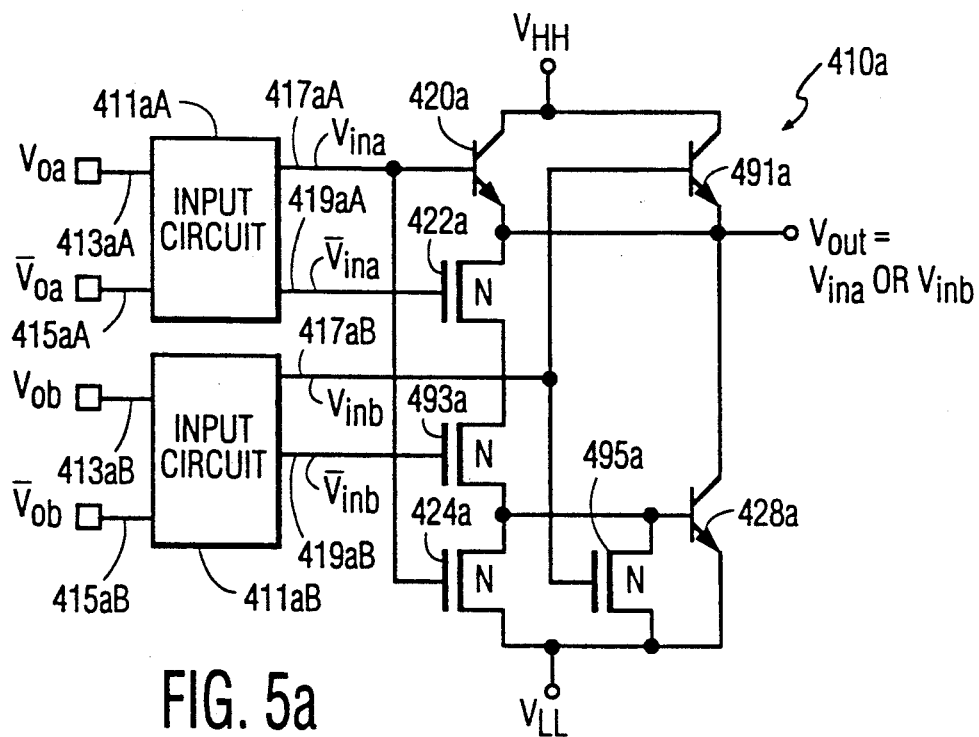
FIGS. 5a and 5b are circuit diagrams of differential two-input BiCMOS gates having a single output (OR/NAND) and a differential output (OR/NAND, NOR/AND) respectively.
Figure 5B:
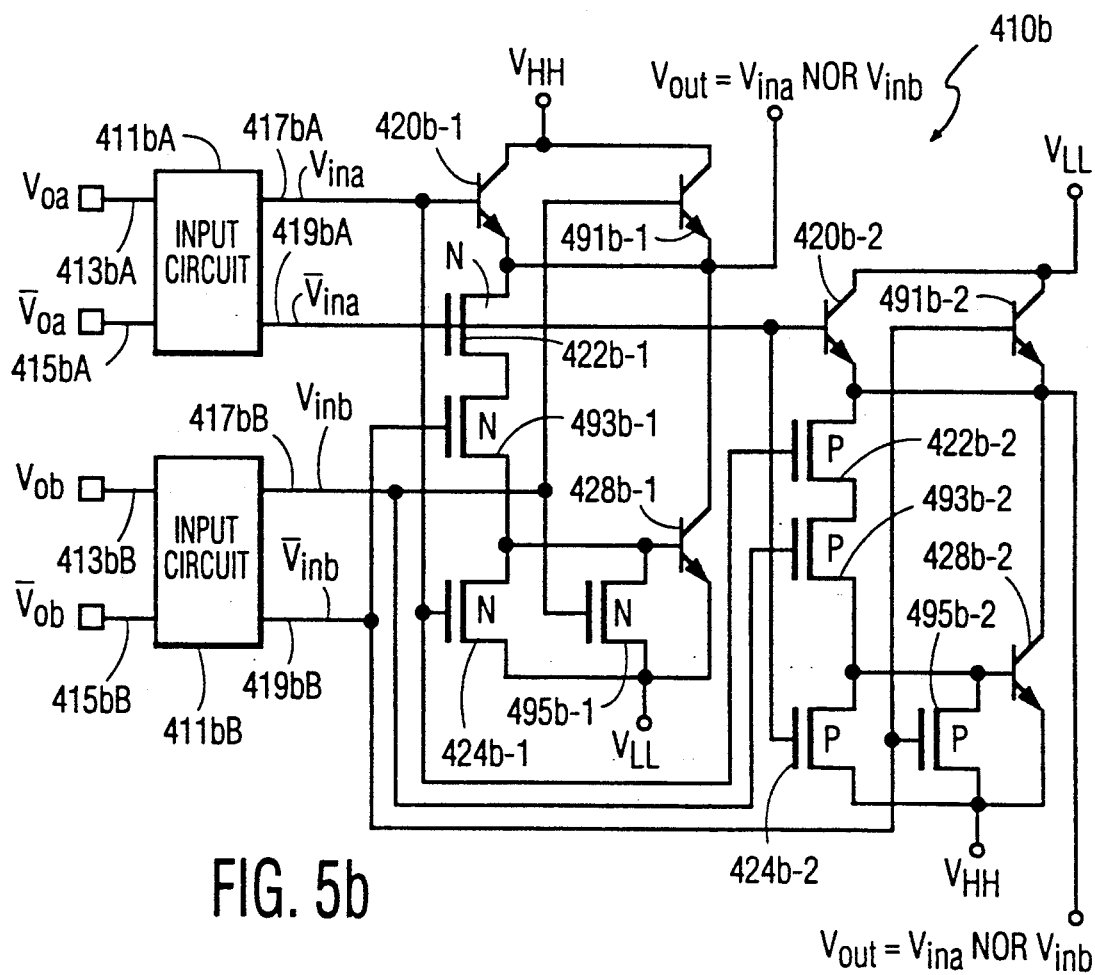

Before turning to FIGS. 5a and 5b, it should be appreciated that the buffers of FIGS. 2b, 3 and 4 are all candidates for cascading; i.e., the differential output of each may be fed as a differential input to any other differential input buffer including those buffers of FIGS. 1a, 1b, and 2a, as well as those of the art. Among other reasons, cascading of buffers is desirable for providing an extremely fast delay line, with taps taken from the output of each stage. In such a situation it is preferable that each of the cascaded buffers be identical. Also, increased drive is obtained by cascading buffers in a "tree" arrangement, with the outputs of a first buffer being fed as inputs to a plurality of parallel buffers.

Turning to FIG. 5a, it shows an OR/AND gate 410a that responds (1) to a first differential input formed with a noninverting input $V_{ina}$ and an inverting input $\overline{V}_{ina}$ and (2) to a second differential input formed with a noninverting input $V_{inb}$ and an inverting input $\overline{V}_{inb}$. OR/NAND gate 410a is related to the buffer of FIG. 1a. Thus, npn bipolar transistors 420a and 428a as well as nMOS transistors 422a and 424a are provided. As in the buffer of FIG. 1a, the collector of transistor 420a is coupled to the high voltage rail, the base is coupled to the input signal $V_{ina}$, and the emitter is coupled to the collector of transistor 428a. The emitter of transistor 428a is coupled to the low voltage rail, while the base is coupled to the drain of transistor 424a and the source of transistor 422a (via transistor 493a). The gates of transistors 422a and 424a are respectively coupled to the inverting and noninverting inputs $\overline{V}_{ina}$ and $V_{ina}$. In addition to the circuitry of the buffer of FIG. 1a, OR gate 410a includes an npn bipolar transistor 491a, and two nMOS transistors 493a and 495a. Bipolar transistor 491a is coupled in parallel with transistor 420a, except that its base is coupled to the noninverting input $V_{inb}$ of the second differential input. MOS transistor 493a is provided with its gate electrode coupled to the inverting input $\overline{V}_{inb}$, and with a drain coupled to the emitter of transistor 420a (via transistor 422a) and a source coupled to the drain of MOS transistor 424a. MOS transistor 495a is coupled in parallel with MOS transistor 424a, except that its gate is coupled to the noninverting $V_{inb}$ input.

If either or both of the $V_{ina}$ and $V_{inb}$ inputs go high, one or both of transistors 420a and 491a turn on, and one or both of transistors 424a and 495a also turn on. Also, one or both of transistors 422a and 493a turn off, and bipolar transistor 428a is off, as the voltage at the base thereof is brought to $V_{LL}$ by either transistor 424a or 495a. In such a state, and with bipolar transistor 428a off, the output voltage $V_{out}$ goes high as the output voltage follows the emitter of one of transistors 420a and 491a. Similarly, if both the $V_{ina}$ and $V_{inb}$ inputs go low, transistors 420a, 491a, 424a, and 495a turn off, while transistors 493a and 422a turn on. With transistors 491a and 424a off, and transistors 493a and 422a on, bipolar transistor 428a turns on. With transistor 428a on, and transistors 420a and 491a off, the output $V_{out}$ is pulled low.

It will be appreciated by those skilled in the art that OR gate 410a functions equivalently as a NAND gate in accord with DeMorgan's theorem by reversing the $V_{ina}$ input with the $\overline{V}_{ina}$ input, and the $V_{inb}$ input with the $\overline{V}_{inb}$ input.

A differential output embodiment of the OR/NAND gate of FIG. 5a is seen in FIG. 5b where differential inputs $V_{ina}$, $\overline{V}_{ina}$, and $V_{inb}$, $\overline{V}_{inb}$ are provided on lines 417bA, 419bA, and 417bB and 419bB, and npn transistors 420b-1, 428b-1, 491b-1 and 491b-1 and nMOS transistors 420b-1, 422b-1, 424b-1, 493b-1, and 495b-1 function identically as their equivalents in FIG. 5a to provide an OR/NAND function at the noninverted output $V_{out}$. In addition, pnp transistors 420b-2, 428b-2, and 491b-2, and pMOS transistors 420b-2, 422b-2, 424b-2, 493b-2 and 495b-2 are provided and produce a NOR/AND output at the inverted output $\overline{V}_{out}$ of the differential output. As will readily be appreciated, the pnp and pMOS transistors of the $-2$ section of the circuit are arranged identically to the npn and nMOS transistors of the $-1$ stage, except that the polarity of the inputs 417bA, 419bA, 417bB and 419bB, and the polarity of the voltage rails are reversed.

With the arrangement of FIG. 5b, when one (or both) of $V_{ina}$ and $V_{inb}$ are high, one or both of $\overline{V}_{ina}$ and $\overline{V}_{inb}$ are low, and therefore, one or both of pnp transistors 420b-2, and 491b-2 (and correspondingly pMOS transistors 424b-2 and 495b-2) are turned on. With one or both of transistors 420b-2 and 491b-2 on, the inverted output $\overline{V}_{out}$ is pulled low (i.e. to $V_{in} + V_{be}$). Also, with one or both of transistors 424b-2 and 495b-2 on, the voltage at the base of transistor 428b-2 is brought high, and transistor 428b-2 is kept off such that it does not attempt to pull the voltage at the inverted output high. Conversely, if both $V_{ina}$ and $V_{inb}$ are low, both $\overline{V}_{ina}$ and $\overline{V}_{inb}$ are high, and pnp transistors 420b-2, 491b-2, 424b-2 and 495b-2 turn off, while pMOS transistors 422b-2 and 493b-2 turn on. With transistors 422b-2 and 493b-2 on, and 424b-2 and 495b-2 off, pnp transistor 428b-2 turns on. With pnp transistor 428b-2 on, and transistors 420b-2 and 491b-2 off, the inverted output $\overline{V}_{out}$ is pulled high. It is therefore seen that $\overline{V}_{out}$ is high only when $V_{ina}$ and $V_{inb}$ are low, and is low when either $V_{ina}$ or $V_{inb}$ is high; a classical NOR gate. As with the noninverted output which is changed from an OR function to a NAND function, by reversing the $V_{ina}$ and $\overline{V}_{ina}$ inputs 417bA and 419bA and $V_{inb}$ and $\overline{V}_{inb}$ inputs 417bB and 419bB, the inverted output $\overline{V}_{out}$ is changed from a NOR to an AND function with such a reversal.

Figure 6:
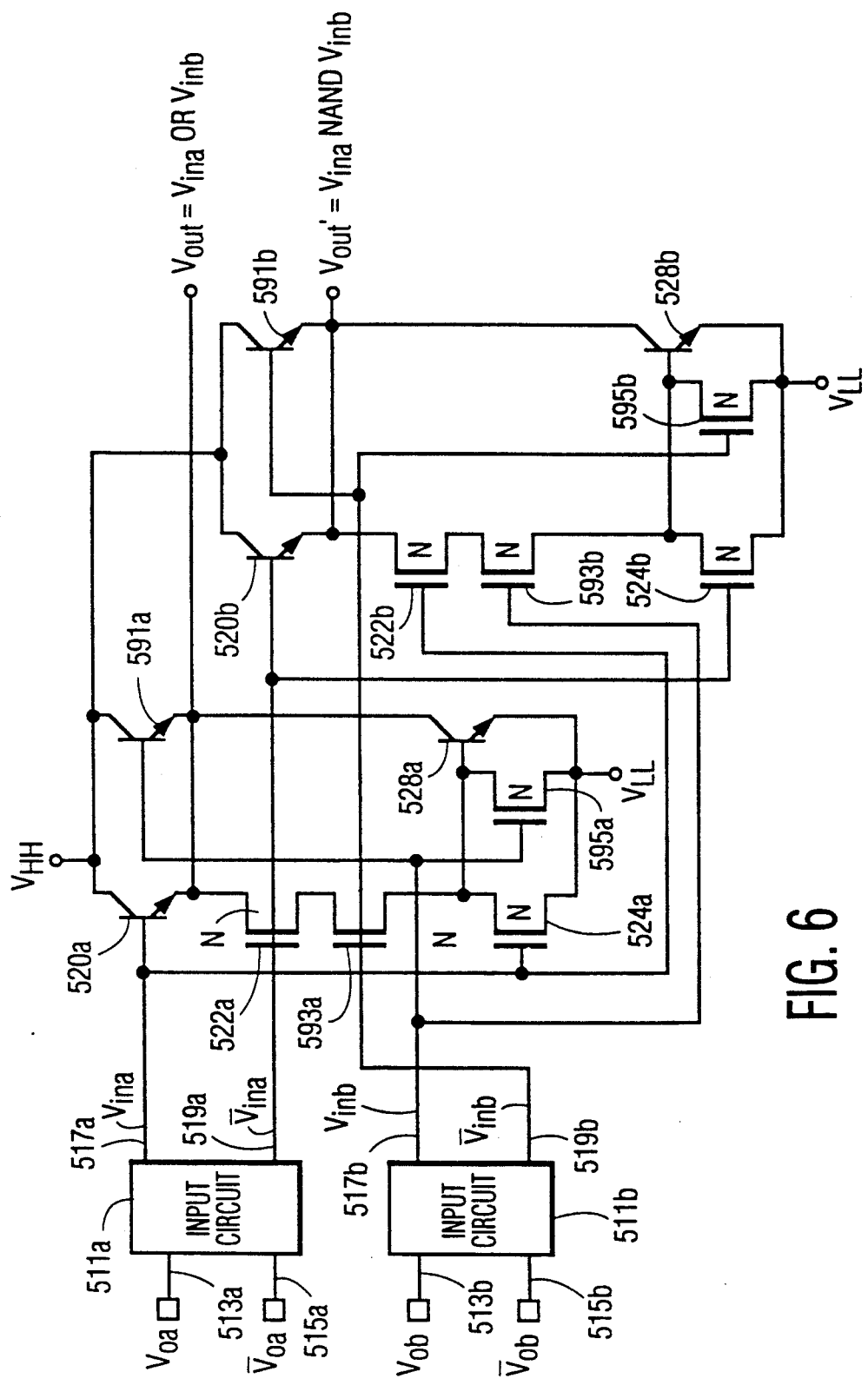
FIG. 6 is a circuit diagram of a differential two-input BiCMOS gate having two single ended outputs.

The logic gate of FIG. 6 incorporates the circuitry of FIG. 5a, along with duplicative circuitry which receives inverted inputs and which provides a second single ended output $V_{out'}$. The second single ended output $V_{out'}$ does not together with the first output $V_{out}$ provide a differential output, as the second single ended output is not the inverse of the first single ended output.

As seen in FIG. 6, the OR gate of FIG. 5a is set forth with bipolar transistors 520a, 528a, and 591a, and with nMOS transistors 522a, 524a, 593a, and 595a. Also, duplicative bipolar transistors 520b, 528b, and 591b, and nMOS transistors 522b, 524b, 593b, and 595b are provided. As indicated above in the discussion regarding FIG. 5a, an OR function is provided at the emitters of transistors 520a and 591a. Also, as indicated above in the discussion regarding FIG. 5b, and the ability to change an OR into a NAND gate by reversing the inputs, it will be appreciated that a NAND function is provided at the emitters of transistors 520b and 591b, as the voltage $V_{out'}$ only goes low when both $V_{ina}$ and $V_{inb}$ are both high.

There have been described and illustrated herein differential input BiCMOS buffer, inverters, and gates. While particular embodiments have been described, it is not intended that the invention be limited thereto as it is intended that the invention be broad in scope as the art will allow. Thus, for example, while an nMOS transistor is used in most of the buffer and inverter embodiments to cause the base of the lower bipolar transistor of the two bipolar transistor arrangement to quickly reach the voltage of the low voltage rail (i.e., a hard pull off the base), it will he appreciated that a resistor could be substituted for that nMOS transistor in the embodiments of FIGS. 4–6 as described above for the circuitry of FIGS. 1a–2b. Alternatively, that transistor can be eliminated entirely from the circuit as shown in FIGS. 1a(2), although current leakage could result.

Also, while a two differential input OR/NAND (and NOR/AND) gate was shown, it will be appreciated that gates having as many differential inputs as desired can be constructed by providing additional bipolar transistors with bases connected to additional (inputs - e.g., "$V_{inc}$" and "$V_{ind}$") in parallel with the bipolar transistors having the $V_{ina}$ and $V_{inb}$ input signals connected to their bases, by providing additional MOS transistors with inverting $\overline{V}_{inc}$ and $\overline{V}_{ind}$ gate inputs in series with the MOS transistors having the $\overline{V}_{ina}$ and $\overline{V}_{inb}$ inputs to their gates, and by further providing additional MOS transistors with $V_{inc}$ and $V_{ind}$ gate inputs in parallel with the parallel MOS transistors with $V_{ina}$ and $V_{inb}$ gate inputs. Further, while use of npn bipolar transistors was disclosed in conjunction with advantageous location of nMOS and pMOS transistors, it will be appreciated that pnp bipolar transistors as well as substitution of pMOS for nMOS transistors and vice versa could be effectively utilized with minor changes which would be apparent to those skilled in the art. Therefore, it will be appreciated by those skilled in the art that yet other modifications could be made to the provided invention without deviating from its spirit and scope as so claimed.

We claim:

1. An electronic circuit comprising:

input means for providing a differential input formed with a noninverting input and an inverting input;

a first bipolar transistor having a base directly coupled to the noninverting input, a collector coupled to a first voltage reference rail, and an emitter;

a second bipolar transistor having a base directly coupled to the inverting input, a collector coupled to the first rail, and an emitter;

a third bipolar transistor having a base, a collector directly coupled to the emitter of the first bipolar transistor, and an emitter coupled to a second voltage reference rail;

a fourth bipolar transistor having a base, a collector directly coupled to the emitter of the second bipolar transistor, and an emitter coupled to the second rail;

a first MOS transistor having a gate electrode directly coupled to the inverting input, a drain coupled to the emitter of the third bipolar transistor, and a source coupled to the base of the third bipolar transistor;

a second MOS transistor having a gate electrode directly coupled to the noninverting input, a drain coupled to the emitter of the second bipolar transistor, and a source coupled to the base of the fourth bipolar transistor, the first and second MOS transistors being of a first type;

a third MOS transistor having a gate electrode directly coupled to the inverting input, a source coupled to the first rail, and a drain coupled to the emitter of the first bipolar transistor; and a fourth MOS transistor having a gate electrode directly coupled to the noninverting input, a source coupled to the first rail, and a drain coupled to the emitter of the second bipolar transistor, the third and fourth MOS transistors being of a second MOS type opposite to the first MOS type, a pair of outputs of the circuit being available at nodes respectively at the emitters of the first and second bipolar transistors.

2. A circuit as in claim 1 wherein the noninverting and inverting inputs are substantially synchronous.

3. A circuit as in claim 2 wherein the bipolar transistors are of a first bipolar type, the first MOS type is nMOS when the first bipolar type is npn, and the first MOS type is pMOS when the first bipolar type is pnp.

4. A circuit as in claim 3 further including:

a fifth MOS transistor having a gate electrode that receives the noninverting input, a drain coupled to the source of the first MOS transistor, and a source coupled to the second rail; and a sixth MOS transistor having a gate electrode that receives the inverting input, a drain coupled to the source of the second MOS transistor, and a source coupled to the second rail, the fifth and sixth MOS transistors being of the first MOS type.

5. A circuit as in claim 3 further including:

a first resistor coupled between the source of the first MOS transistor and the second rail.

a second resistor coupled between the source of the second MOS transistor and the second rail.

6. An electronic circuit responsive to a differential input formed with a noninverting input and an inverting input, the circuit comprising:

a first bipolar transistor having a base responsive to the noninverting input, a collector coupled to a first voltage reference rail, and an emitter;

a second bipolar transistor having a base responsive to the inverting input, a collector coupled to the first rail, and an emitter;

a third bipolar transistor having a base, a collector coupled to the emitter of the first bipolar transistor, and an emitter coupled to a second voltage reference rail;

a fourth bipolar transistor having a base, a collector coupled to the emitter of the second bipolar transistor, and an emitter coupled to the second rail;

a first MOS transistor having a gate electrode responsive to the inverting input, a drain coupled to the emitter of the first bipolar transistor, and a source coupled to the base of the third bipolar transistor;

a second MOS transistor having a gate electrode responsive to the noninverting input, a drain coupled to the emitter of the second bipolar transistor, and a source coupled to the base of the fourth bipolar transistor, the first and second MOS transistors being of a first MOS type;

a third MOS transistor having a gate electrode coupled to the emitter of the second bipolar transistor, a source coupled to the first rail, and a drain coupled to the emitter of the first bipolar transistor; and a fourth MOS transistor having a gate electrode coupled to the emitter of the first bipolar transistor, a source coupled to the first rail, and a drain coupled to the emitter of the second bipolar transistor, the third and fourth MOS transistors being of a second MOS type opposite to the first MOS type, a pair of outputs of the circuit being available at nodes respectively coupled to the emitters of the first and second bipolar transistors.

7. A circuit as in claim 6 wherein the noninverting and inverting inputs are substantially synchronous.

8. A circuit as in claim 7 wherein the bipolar transistors are of a first bipolar type, the first MOS type is nMOS when the first bipolar type is npn, and the first MOS type is pMOS when the first bipolar type is pnp.

9. A circuit as in claim 8 further including:
a fifth MOS transistor having a gate electrode responsive to the noninverting input, a drain coupled to the source of the first MOS transistor, and a source coupled to the second rail; and a sixth MOS transistor having a gate electrode responsive to the inverting input, a drain coupled to the source of the second MOS transistor, and a source coupled to the second rail, the fifth and sixth MOS transistors being of the first MOS type.

10. A circuit as in claim 9 further including input means for providing the differential input.

11. A circuit as in claim 8 further including:
a first resistor coupled between the source of the first MOS transistor and the second rail; and a second resistor coupled between the source of the second MOS transistor and the second rail.

12. An electronic circuit responsive to (a) a first differential input formed with a first noninverting input and a first inverting input and (b) a second differential input formed with a second noninverting input and a second inverting input, the circuit comprising:
a first bipolar transistor having a base responsive to the first noninverting input, a collector coupled to a first voltage reference rail, and an emitter;

a second bipolar transistor having a base responsive to the second noninverting input, a collector coupled to the first rail, and an emitter coupled to the emitter of the first bipolar transistor;

a third bipolar transistor having a base, a collector coupled to the emitter of the first bipolar transistor, and an emitter coupled to a second voltage reference rail;

a first MOS transistor having a gate electrode responsive to the first inverting input, a drain, and a source; and a second MOS transistor having a gate electrode responsive to the second inverting input, a drain, and a source, the first and second MOS transistors being arranged in series such that the drain and source of one are respectively coupled to the emitter of the first bipolar transistor and to the drain of the other whose source is coupled to the base of the first bipolar transistor, an output of the circuit being available at a node coupled to the emitter of the first bipolar transistor.

13. A circuit as in claim 12 wherein (a) the first noninverting and inverting inputs are substantially synchronous and (b) the second noninverting and inverting inputs are substantially synchronous.

14. A circuit as in claim 13 wherein the MOS transistors are all of a first MOS type, the bipolar transistors are of a first bipolar type, the first MOS type is nMOS when the first bipolar type is npn, and the first MOS type is pMOS when the first bipolar type is pnp.

15. A circuit as in claim 14 further including:
a third MOS transistor having a gate electrode responsive to the first noninverting input, a drain coupled to the base of the third bipolar transistor, and a source coupled to the second rail; and a fourth MOS transistor having a gate electrode responsive to the second noninverting input, a drain coupled to the base of the third bipolar transistor, and a source coupled to the second rail, the third and fourth MOS transistors being of the first MOS type.

16. A circuit as in claim 15 further including input means for providing the first and second differential inputs.

17. A circuit as in claim 14 further including a resistor coupled between the base of the third bipolar transistor and the second rail.

18. An electronic circuit responsive to (a) a first differential input formed with a first noninverting input and a first inverting input and (b) a second differential input formed with a second noninverting input and a second inverting input, the circuit comprising:
a first bipolar transistor having a base responsive to the first noninverting input, a collector coupled to a first voltage reference rail, and an emitter;

a second bipolar transistor having a base responsive to the second noninverting input, a collector coupled to the first rail, and an emitter coupled to the emitter of the first bipolar transistor;

a third bipolar transistor having a base, a collector coupled to the emitter of the first bipolar transistor, and an emitter coupled to a second voltage reference rail;

a first MOS transistor having a gate electrode responsive to the first inverting input, a drain, and a source;

a second MOS transistor having a gate electrode responsive to the second inverting input, a drain, and a source, the first and second MOS transistors being arranged in series such that the drain and the source of one are respectively coupled to the emitter of the first bipolar transistor and to the drain of the other whose source is coupled to the base of the third bipolar transistor;

a fourth bipolar transistor having a base responsive to the first inverting input, a collector coupled to the first rail, and an emitter;

a fifth bipolar transistor having a base responsive to the second inverting input, a collector coupled to the first rail, and an emitter coupled to the emitter of the fourth bipolar transistor;

a sixth bipolar transistor having a base, a collector coupled to the emitter of the fourth bipolar transistor, and an emitter coupled to the second rail;

a third MOS transistor having a gate electrode responsive to the first noninverting input, a drain, and a source; and a fourth MOS transistor having a gate electrode responsive to the second noninverting input, a drain, and a source, the third and fourth MOS transistors being arranged in series such that the drain and source of one are respectively coupled to the emitter of the fourth bipolar transistor and to the drain of the other whose source is coupled to the base of the sixth bipolar transistor, a pair of outputs of the circuit being available at nodes respectively coupled to the emitters of the first and fourth bipolar transistors.

19. A circuit as in claim 18 wherein (a) the first noninverting and inverting inputs are substantially synchronous and (b) the second noninverting and inverting inputs are substantially synchronous.

20. A circuit as in claim 19 wherein the MOS transistors are all of a first MOS type, the bipolar transistors are of a first bipolar type, the first MOS type is nMOS when the first bipolar type is npn, and the first MOS type is pMOS when the first bipolar type is pMOS.

21. A circuit as in claim 20 further including:
a fifth MOS transistor having a gate electrode responsive to the first noninverting input, a drain coupled to the base of the third bipolar transistor, and a source coupled to the second rail;

a sixth MOS transistor having a gate electrode responsive to the second noninverting input, a drain coupled to the base of the third bipolar transistor, and a source coupled to the second rail;

a seventh MOS transistor having a gate electrode responsive to the first inverting input, a drain coupled to the base of the sixth bipolar transistor, and a source coupled to the second rail; and an eighth MOS transistor having a gate electrode responsive to the second inverting input, a drain coupled to the base of the sixth bipolar transistor, and a source coupled to the second rail, the fifth, sixth, seventh, and eighth MOS transistors being of the first MOS type.

22. A circuit as in claim 21 further including input means for providing the first and second differential inputs.

23. A circuit as in claim 20 further including:
a first resistor coupled between the base of the third bipolar transistor and the second rail; and
a second resistor coupled between the base of the sixth bipolar transistor and the second rail.

24. An electronic circuit responsive to (a) a first differential input formed with a first noninverting input and a first inverting input and (b) a second differential input formed with a second noninverting input and a second inverting input, the circuit comprising:

a first npn transistor having a base responsive to the first noninverting input, a collector coupled to a high voltage reference rail, and an emitter;

a second npn transistor having a base responsive to the second noninverting input, a collector coupled to the high rail, and an emitter coupled to the emitter of the first npn transistor;

a third npn transistor having a base, a collector coupled to the emitter of the first npn transistor, and an emitter coupled to a low voltage reference rail;

a first nMOS transistor having a gate electrode responsive to the first inverting input, a drain, and a source;

a second nMOS transistor having a gate electrode responsive to the second inverting input, a drain, and a source, the two nMOS transistors being arranged in series such that the drain and the source of one are respectively coupled to the emitter of the first npn transistor and to the drain of the other whose source is coupled to the base of the third npn transistor;

a first pnp transistor having a base responsive to the first inverting input, a collector coupled to the low rail, and an emitter;

a second pnp transistor having a base responsive to the second inverting input, a collector coupled to the low rail, and an emitter coupled to the emitter of the first pnp transistor;

a third pnp transistor having a base, a collector, coupled to the emitter of the first pnp transistor, and an emitter coupled to the high rail;

a first pMOS transistor having a gate electrode responsive to the first noninverting input, a drain, and a source; and a second pMOS transistors having a gate electrode responsive to the second noninverting input, a drain, and a source, the two pMOS transistors being arranged in series such that the drain and the source of one are respectively coupled to the emitter of the first pnp transistor and to the drain of the other whose source is coupled to the base of the third pnp transistor, a pair of outputs of the circuit being available at nodes respectively coupled to the emitters of the first npn and pnp transistors.

25. A circuit as in claim 24 wherein (a) the first noninverting and inverting inputs are substantially synchronous and (b) the second noninverting and inverting inputs are substantially synchronous.

26. A circuit as in claim 25 further including:
a third nMOS transistor having a gate electrode responsive to the first noninverting input, a drain coupled to the base of the third npn transistor, and a source coupled to the low rail;

a fourth nMOS transistor having a gate electrode responsive to the second noninverting input, a drain coupled to the base of the third npn transistor, and a source coupled to the low rail;

a third pMOS transistor having a gate electrode responsive to the first inverting input, a drain coupled to the base of the third pnp transistor, and a source coupled to the high rail; and a fourth pMOS transistor having a gate electrode responsive to the second inverting input, a drain coupled to the base of the third pnp transistor, and a source coupled to the high rail.

27. A circuit as in claim 26 further including input means for providing the first and second differential inputs.

28. A circuit as in claim 26 further including:
a first resistor coupled between the base of the third npn transistor and the low rail.
a second resistor coupled between the base of the third pnp transistor and the high rail.

29. An electronic circuit responsive to a differential input formed with a noninverting input and an inverting input, the circuit comprising:
a first bipolar transistor having a base responsive to the noninverting input, a collector coupled to a first voltage reference rail, and an emitter;
a second bipolar transistor having a base responsive to the inverting input, a collector coupled to the first rail, and an emitter;
a first MOS transistor having a gate electrode responsive to the inverting input, a drain coupled to the emitter of the first bipolar transistor, and a source coupled to a second voltage reference rail;
a second MOS transistor having a gate electrode responsive to the noninverting input, a drain coupled to the emitter of the second bipolar transistor, and a source coupled to the second rail, the first and second MOS transistors being of a first MOS type;
a third MOS transistor having a gate electrode coupled to the emitter of the second bipolar transistor, a source coupled to the first rail, and a drain coupled to the emitter of the first bipolar transistor; and
a fourth MOS transistor having a gate electrode coupled to the emitter of the first bipolar transistor, a source coupled to the first rail, and a drain coupled to the emitter of the second bipolar transistor, the third and fourth MOS transistors being of a second MOS type opposite to the first MOS type, a pair of outputs of the circuit being available at nodes coupled to the emitters of the bipolar transistors.

30. A circuit as in claim 29 wherein the noninverting and inverting inputs are substantially synchronous.

31. A circuit as in claim 30 wherein the bipolar transistors are of a first bipolar type, the first MOS type is nMOS when the first bipolar type is npn, and the first MOS type is pMOS when the first bipolar type is pnp.

32. A circuit as in claim 31 further including input means for providing the differential input.

33. A circuit as in claim 1 wherein the collectors of the third and fourth bipolar transistors are respectively connected directly to the emitters of the first and second bipolar transistors.

34. An electronic circuit comprising:
input means for providing a differential input formed with a noninverting input and an inverting input;
a first bipolar transistor having a base directly coupled to the noninverting input, a collector coupled to a first voltage reference rail, and an emitter;
a second bipolar transistor having a base directly coupled to the inverting input, a collector coupled to the first rail, and an emitter;
a third bipolar transistor having a base, a collector directly coupled to the emitter of the first bipolar transistor, and an emitter coupled to a second voltage reference rail;
a fourth bipolar transistor having a base, a collector directly coupled to the emitter of the second bipolar transistor, and an emitter coupled to the second rail;
a first MOS transistor having a gate electrode directly coupled to the inverting input, a drain coupled to the emitter of the first bipolar transistor, and a source coupled to the base of the third bipolar transistor; and
a second MOS transistor having a gate electrode directly coupled to the noninverting input, a drain coupled to the emitter of the second bipolar transistor, and a source coupled to the base of the fourth bipolar transistor, a pair of outputs of the circuit being available at nodes respectively at the emitters of the first and second bipolar transistors.

35. A circuit as in claim 34 wherein the noninverting and inverting inputs are substantially synchronous.

36. A circuit as in claim 35 wherein the bipolar transistors are of a first bipolar type, the MOS transistors are of a first MOS type, the first MOS type is nMOS when the first bipolar type is npn, and the first MOS type is pMOS when the first bipolar type is pnp.

37. A circuit as in claim 36 further including:
a third MOS transistor having a gate electrode that receives the noninverting input, a drain coupled to the source of the first MOS transistor, and a source coupled to the second rail; and
a fourth MOS transistor having a gate electrode that receives the inverting input, a drain coupled to the source of the second MOS transistor, and a source coupled to the second rail, the third and fourth MOS transistors being of the first MOS type.

38. A circuit as in claim 36 further including:
a first resistor coupled between the source of the first MOS transistor and the second rail; and
a second resistor coupled between the source of the second MOS transistor and the second rail.

39. A circuit as in claim 34 wherein the collectors of the third and fourth bipolar transistors are respectively connected directly to the emitters of the first and second bipolar transistors.

* * * * *